(12) United States Patent
Rausch

(10) Patent No.: US 10,177,345 B2
(45) Date of Patent: *Jan. 8, 2019

(54) ORGANIC LIGHT-EMITTING DEVICE AND METHOD FOR PRODUCING THE ORGANIC LIGHT-EMITTING DEVICE

(71) Applicant: OSRAM OLED GmbH, Regensburg (DE)

(72) Inventor: Andreas Rausch, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 123 days.

This patent is subject to a terminal disclaimer.

(21) Appl. No.: 15/035,359

(22) PCT Filed: Dec. 1, 2014

(86) PCT No.: PCT/EP2014/076085
§ 371 (c)(1),
(2) Date: May 9, 2016

(87) PCT Pub. No.: WO2015/082394
PCT Pub. Date: Jun. 11, 2015

(65) Prior Publication Data
US 2016/0293896 A1    Oct. 6, 2016

(30) Foreign Application Priority Data

Dec. 5, 2013   (DE) .................. 10 2013 113 531
Jan. 28, 2014  (DE) .................. 10 2014 100 993

(51) Int. Cl.
H01L 51/52    (2006.01)
H01L 51/50    (2006.01)
(Continued)

(52) U.S. Cl.
CPC ............ H01L 51/5284 (2013.01); G02B 5/22 (2013.01); H01L 27/322 (2013.01);
(Continued)

(58) Field of Classification Search
CPC ............ H01L 51/5036; H01L 51/5278; H01L 27/322; H01L 51/0003; H01L 51/5284;
(Continued)

(56) References Cited

U.S. PATENT DOCUMENTS

2005/0040763 A1   2/2005   Yoon et al.
2005/0147844 A1   7/2005   Hatwar et al.
(Continued)

FOREIGN PATENT DOCUMENTS

CN       1585583 A      2/2005
DE    102011056448 A1   6/2012
(Continued)

OTHER PUBLICATIONS

Kobayashi N. et al., "Synthesis, Spectroscopy, and Electrochemistry of Tetra-tert-butylated Tetraazaporphyrins, Phthalocyanines, Naphthalocyanines, and Anthracocyanines, Together With Molecular Obrital Calculations", Chem. Eur. J., 2004, vol. 10, pp. 6294-6312.

(Continued)

Primary Examiner — Golam Mowla
(74) Attorney, Agent, or Firm — Slater Matsil, LLP

(57) ABSTRACT

An organic light-emitting device and a method for producing an organic light-emitting device are disclosed. In an embodiment, the OLED includes a substrate, a first electrode disposed on the substrate, at least one first organic functional layer stack disposed on the first electrode, the first organic functional layer stack configured to emit radiation in a first wavelength range, a second electrode disposed on the first organic functional layer stack and a filter layer arranged in (Continued)

a beam path of the first organic functional layer stack, wherein the first wavelength range comprises a low-energy sub-range and a high-energy sub-range and wherein the filter layer comprises an absorption range containing the low-energy or the high-energy sub-range of the first wavelength range.

13 Claims, 6 Drawing Sheets

(51) Int. Cl.
*H01L 27/32* (2006.01)
*G02B 5/22* (2006.01)
*H01L 51/00* (2006.01)
*H01L 51/56* (2006.01)

(52) U.S. Cl.
CPC ........ *H01L 51/001* (2013.01); *H01L 51/0003* (2013.01); *H01L 51/504* (2013.01); *H01L 51/5036* (2013.01); *H01L 51/5056* (2013.01); *H01L 51/5072* (2013.01); *H01L 51/5206* (2013.01); *H01L 51/5221* (2013.01); *H01L 51/5278* (2013.01); *H01L 51/56* (2013.01); *H01L 51/0077* (2013.01); *H01L 51/0083* (2013.01); *H01L 51/0084* (2013.01); *H01L 51/0091* (2013.01)

(58) Field of Classification Search
CPC ............ H01L 51/5221; H01L 51/5206; H01L 51/5072; H01L 51/5056; H01L 51/56; H01L 51/0091; H01L 51/0084; H01L 51/0083; H01L 51/0077; H01L 51/001; H01L 51/504; G02B 5/22
See application file for complete search history.

(56) References Cited

U.S. PATENT DOCUMENTS

| | | |
|---|---|---|
| 2005/0189857 A1 | 9/2005 | Kobori |
| 2007/0114522 A1 | 5/2007 | Kwok et al. |
| 2012/0091923 A1 | 4/2012 | Kastner-Jung et al. |
| 2012/0161114 A1 | 6/2012 | Kim et al. |
| 2015/0028312 A1 | 1/2015 | Lang et al. |
| 2015/0255751 A1 | 9/2015 | Schwamb |

FOREIGN PATENT DOCUMENTS

| | | |
|---|---|---|
| DE | 102012200224 A | 7/2013 |
| EP | 1511095 A2 | 3/2005 |
| EP | 1536470 A2 | 6/2005 |
| EP | 2330654 A1 | 6/2011 |
| JP | 2006310075 A | 11/2006 |
| WO | 2009031406 A1 | 3/2009 |
| WO | 2010066245 A1 | 6/2010 |
| WO | 2010105141 A2 | 9/2010 |

OTHER PUBLICATIONS

Kobayashi N. et al., "Spectroscopic Comparison of tetra-tertbutylated Tetraaazaporphyrin, phthalocyanine, Naphthalocyanine and Anthracocyanine Cobalt Complexes", Inorganica Chimica, Acta, 1993, vol. 210, pp. 131-133.

ORGANIC LIGHT-EMITTING DEVICE AND METHOD FOR PRODUCING THE ORGANIC LIGHT-EMITTING DEVICE

This patent application is a national phase filing under section 371 of PCT/EP2014/076085, filed Dec. 1, 2014, which claims the priority of German patent application 10 2013 113 531.5, filed Dec. 5, 2013 and German patent application 10 2014 100 993.2, filed Jan. 28, 2014, each of which is incorporated herein by reference in its entirety.

TECHNICAL FIELD

An organic light-emitting device and a method for producing the organic light-emitting device are provided.

BACKGROUND

Organic light-emitting devices, such as, for example, organic light-emitting diodes (OLEDs), conventionally contain fluorescent or phosphorescent emitter materials. The organic molecules used for this purpose generally have a wide, defined emission spectrum which, without using additional, external converters, cannot be shifted into the high- or low-energy range of the visible spectrum. Achieving low-energy, i.e. dark red, emission is moreover difficult since the quantum efficiency of the emitter materials increases sharply with increasing wavelength due to an exponential increase in the non-radiative rate.

For example, red emitting materials with a dominant wavelength of at most 610 to 615 nm are used in today's OLEDs. Currently, the only option for shifting this dominant wavelength towards larger wavelengths involves using converter materials which are applied externally onto the OLED. This disadvantageously has a negative impact on the appearance and thus the shape and design advantage of OLEDs and color conversion moreover generally results in a severe reduction in efficiency.

SUMMARY

Embodiments of the invention provide an organic light-emitting device. Further embodiments provide a method for producing the organic light-emitting device.

In various embodiment an organic light-emitting device is provided which has a substrate, a first electrode on the substrate, at least one first organic functional layer stack which emits radiation in a first wavelength range on the first electrode, a second electrode on the first organic functional layer stack and a filter layer which is arranged in the beam path of the first organic functional layer stack. The first wavelength range here comprises a low-energy sub-range and a high-energy sub-range and the filter layer comprises an absorption range which contains the low-energy or the high-energy sub-range of the first wavelength range.

With regard to the arrangement of the layers and layer stacks, "on" should here and hereinafter in principle be taken to mean a sequence and should be understood to the effect that a first layer is either arranged on a second layer in such a manner that the layers have a common interface, i.e. are in direct mechanical and/or electrical contact with one another, or that still further layers are arranged between the first layer and the second layer.

The organic functional layer stack may in each case comprise layers with organic polymers, organic oligomers, organic monomers, small organic, non-polymeric molecules ("small molecules") or combinations thereof. The stack may furthermore comprise at least one organic light-emitting layer.

Materials suitable for the organic light-emitting layer are materials which have radiation emission based on fluorescence or phosphorescence, for example Ir or Pt complexes, polyfluorene, polythiophene or polyphenylene, or derivatives, compounds, mixtures or copolymers thereof. The organic functional layer stack may moreover comprise a functional layer which takes the form of a hole-transport layer, to allow effective hole injection into the at least one light-emitting layer. Materials which may prove advantageous for a hole-transport layer are, for example, tertiary amines, carbazole derivatives, polyaniline doped with camphorsulfonic acid or polyethylenedioxythiophene doped with polystyrenesulfonic acid. The organic functional layer stack may moreover in each case comprise a functional layer, which takes the form of an electron-transport layer. Furthermore, the organic functional layer stack may also comprise electron- and/or hole-blocking layers.

With regard to the basic structure of an organic light-emitting device, for example, in terms of the structure, the layer composition and the materials of the organic functional layer stack, reference is made to document WO 2010/066245 A1, which is hereby explicitly included by reference, in particular in relation to the structure of an organic light-emitting device.

The substrate may, for example, comprise one or more materials in the form of a layer, a sheet, a film or a laminate, which are selected from glass, quartz, plastics, metal and silicon wafer. The substrate particularly preferably comprises or consists of glass, for example, in the form of a glass layer, glass film or glass sheet.

The filter layer being arranged in the beam path of the first organic functional layer stack means that the radiation generated in the organic functional layer stack passes through the filter layer, such that, for an external observer, a color appearance modified by the filter layer is obtained as the overall emission from the device.

"Radiation in a first wavelength range" should be taken to mean the spectral range of the emission spectrum of the first functional layer stack. The first wavelength range here comprises high- and low-energy sub-regions and a dominant wavelength, i.e. the wavelength which is perceived as color by an external observer. The high- and low-energy sub-regions are in themselves perceived as a lighter or darker color and accordingly have an influence on the dominant wavelength. In an emission spectrum, they are visible as the flanks on left-hand and right-hand edges, i.e. at the highest and lowest wavelengths of the spectrum.

This influence by high-energy or low-energy sub-regions of the first wavelength range is reduced by the use of the filter layer, since the filter layer has an absorption range which contains the low-energy or the high-energy sub-range of the first wavelength range. In other words, the filter layer absorbs the radiation emitted by the first organic functional layer stack which is located in the high-energy or the low-energy sub-range of the first wavelength range, while the remaining radiation of the first wavelength range is not absorbed by the filter layer.

The absorption range of the filter layer "containing" the low-energy or the high-energy sub-range of the first wavelength range should be taken to mean that the filter layer may also have absorption ranges outside the first wavelength range absorption region but no further absorption ranges in the first wavelength range or only slightly absorbing such further absorption ranges. "Contain" is moreover intended to mean that the absorption range of the filter layer corresponds to the high-energy or low-energy sub-range of the first wavelength range or is slightly smaller or larger than the respective sub-range. Absorption in the low- or high-energy sub-range of the first wavelength range may be complete or largely complete.

Emission intensity is thus attenuated in these ranges, while the remaining emission ranges of the first organic functional layer stack remain unaffected. Specific ranges of the first wavelength range may thus be reduced in intensity by absorption, while other ranges or emission bands are not attenuated. If, for example, red radiation is emitted by the first functional layer stack and the filter layer absorbs in the high-energy sub-range, the yellow to light red components of the emitted radiation may be absorbed and the dominant wavelength may accordingly be shifted into the dark red spectral range.

The first and second electrodes between which the organic functional layer stack is arranged may, for example, both be translucent, such that the light generated in the at least one light-emitting layer between the two electrodes may be emitted in both directions, i.e. in the direction of the substrate and in the direction away from the substrate. Moreover, for example, all the layers of the organic light-emitting device may be translucent, such that the organic light-emitting device forms a translucent and in particular a transparent OLED. It may furthermore also be possible for one of the two electrodes between which the organic functional layer stack is arranged to be non-translucent and preferably reflective, such that the light generated in the at least one light-emitting layer between the two electrodes may be emitted in just one direction by the translucent electrode. If the electrode arranged on the substrate is translucent and the substrate is also translucent, the term "bottom emitter" may also be used, while if the electrode arranged remote from the substrate is translucent, the term "top emitter" is used.

The first and the second electrode may mutually independently comprise a material which is selected from a group which comprises metals, electrically conductive polymers, transition metal oxides and transparent conductive oxides (TCOs). The electrodes may also be layer stacks of a plurality of layers of the same or different metals or the same or different TCOs.

Suitable metals are, for example, Ag, Pt, Au, Mg, Al, Ba, In, Ca, Sm or Li, and compounds, combinations or alloys thereof.

Transparent conductive oxides ("TCO" for short) are transparent, conductive materials, generally metal oxides, such as, for example, zinc oxide, tin oxide, cadmium oxide, titanium oxide, indium oxide or indium tin oxide (ITO). In addition to binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Moreover, TCOs do not necessarily correspond to a stoichiometric composition and may be also p- or n-doped.

Depending on whether the device is a top emitter, bottom emitter or a bilaterally emitting device, the filter layer is arranged in the beam path in such a manner that the radiation of the first organic functional layer stack passes through the filter layer before it leaves the device. According to one embodiment, the substrate and first electrode of the device are translucent.

Conventional emitter materials may thus be used in the organic functional layer stack in the device and the emitted wavelength range thereof may simultaneously be shifted in a desired color direction.

According to one embodiment, the filter layer contains a material which is selected from a group which comprises metal-containing and metal-free tetraazaporphyrin derivatives (TAPs). The metal-containing TAPs may, for example, be selected from a group which comprises CoTAP, NiTAP, CuTAP, MgTAP, TiOTAP, VOTAP, ZnTAP, AlTAP, FeTAP, SnOTAP and MnTAP. The filter layer may consist of or contain the metal-containing or metal-free TAPs.

TAPs are distinguished by a chromophoric system which is reduced in size in comparison with, for example, phthalocyanine derivatives, as a result of which the absorption bands obtained in the case of phthalocyanines are shifted by up to 100 nm to higher energies, i.e. to smaller wavelengths. The absorption maxima of the TAPs may thus, for example, be between 570 and 592 nm, such that, for example, no absorption any longer occurs in the dark red spectral range, while absorption in the yellow to light red range is distinctly more intense than in the case of the corresponding phthalocyanine derivatives. Metal-containing TAPs may thus, for example, readily be used for reducing the intensity of high-energy emission bands of red emitting materials by absorption.

The filter layer may have a thickness which is selected from a range which comprises 1 nm to 50 nm, preferably 1 nm to 10 nm and in particular 1 nm to 5 nm. Even very thin filter layers which are sufficiently robust and have low voltage losses may thus be formed.

According to one embodiment, the first wavelength range may be selected from the red spectral range. An organic functional layer stack which emits red radiation is thus present. The red radiation comprises a high-energy sub-range in which the radiation is light red to yellow, so establishing the dominant wavelength of the functional layer stack in a range of <615 nm, for example, in a range of approximately 610 to 615 nm. The absorption range of the filter layer may contain the high-energy sub-range of the first wavelength range. The filter layer thus largely or completely absorbs the high-energy sub-range of the radiation emitted by the organic functional layer, so shifting the emission of the first organic functional layer stack into the dark red range. The resultant dominant wavelength of the device may thus be shifted into a range >615 nm, in particular >620 nm.

According to one embodiment, the filter layer may be arranged between the substrate and the first electrode or between the first electrode and the first organic functional layer stack. In this embodiment, the substrate and the first electrode may be translucent, such that the radiation emitted by the first organic functional layer stack emerges from the device through the filter layer.

According to a further embodiment, the device may comprise a second organic functional layer stack, which emits radiation in a second wavelength range, between the first electrode and the first organic functional layer stack, and a charge carrier generation layer stack between the second organic functional layer stack and the first organic functional layer stack.

The explanations provided with regard to the first organic functional layer stack and the first wavelength range apply mutatis mutandis to the second organic functional layer stack and to the second wavelength range.

The charge carrier generation layer stack serves to connect the first organic functional layer stack and the second organic functional layer stack electrically to one another. To this end, the first organic functional layer stack and the second organic functional layer stack are arranged directly adjacent the charge carrier generation layer stack.

The term "charge carrier generation layer stack" is used here and hereafter to describe a layer sequence which takes the form of a tunnel junction and is formed in general by a p-n junction. The charge carrier generation layer stack, which may also be designated "charge-generation layer" (CGL), in particular takes the form of a tunnel junction which may be used for effective charge separation and thus to "generate" charge carriers for the adjacent layers. Due to the stacking of first organic functional layer stack and the second organic functional layer stack, the luminance of the device may be increased and the service life thereof extended.

The charge carrier generation layer stack may comprise at least one hole-transporting layer and an electron-transporting layer and the filter layer may be arranged between the hole-transporting and the electron-transporting layer. The filter layer thus assumes the function of an interlayer between the hole-transporting layer and the electron-transporting layer of the charge carrier generation layer stack. The hole-transporting layer of the charge carrier generation layer stack may also be designated as p-conductive layer and the electron-transporting layer as n-conductive layer. Depending on its function, the filter layer, which is an interlayer, may also be designated as a diffusion barrier layer. The thicker is the filter layer between the hole-transporting layer and the electron-transporting layer, the better can the n- and p-sides, i.e. the hole-transporting layer and the electron-transporting layer of the charge carrier generation layer stack, be separated. The filter layer is also arranged as an interlayer in the beam path at least of the first organic functional layer stack and moreover absorbs in the low- or high-energy sub-range at least of the first wavelength range.

The hole-transporting layer may be undoped or p-doped. p-doping may, for example, be present in the layer in a proportion of less than 10 volume %, in particular of less than 1 volume %. The electron-transporting layer may be undoped or n-doped. For example, the electron-transporting layer may be n-doped and the hole-transporting layer undoped. The electron-transporting layer may furthermore, for example, be n-doped and the hole-transporting layer p-doped.

The hole-transporting layer may comprise a material which is selected from a group which comprises HAT-CN, NHT49, F16CuPc, LG-101, α-NPD, NPB (N,N'-bis(naphthalen-1-yl)-N,N'-bis(phenyl)benzidine), beta-NPB (N,N'-bis(naphthalen-2-yl)-N,N'-bis(phenyl)benzidine), TPD (N,N'-bis(3-methylphenyl)-N,N'-bis(phenyl)benzidine), spiro-TPD (N,N'-bis(3-methylphenyl)-N,N'-bis(phenyl)benzidine), spiro-NPB (N,N'-bis(naphthalen-1-yl)-N,N'-bis(phenyl)spiro), DMFL-TPD (N,N'-bis(3-methylphenyl)-N, N'-bis(phenyl)-9,9-dimethylfluorene), DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphthalen-1-yl)-N,N'-bis(phenyl)-9,9-diphenylfluorene), spiro-TAD (2,2',7,7'-tetrakis(n,n-diphenylamino)-9,9'-spirobifluorene), 9,9-bis[4-(N,N-bis-biphenyl-4-yl-amino)phenyl]-9H-fluorene, 9,9-bis[4-(N,N-bis-naphthalen-2-yl-amino)phenyl]-9H-fluorene, 9,9-bis[4-(N,N-bis-naphthalen-2-yl-N,N'-bis-phenylamino)phenyl]-9H-fluorene, (N,N'-bis(phenanthren-9-yl)-N,N'-bis(phenyl) benzidine, 2,7-bis[N,N-bis(9,9-spiro-bifluoren-2-yl)amino]-9,9-spiro-bifluorene, 2,2'-bis[N,N-bis(biphenyl-4-yl) amino]-9,9-spiro-bifluorene, 2,2'-bis(N,N-diphenylamino)-9,9-spiro-bifluorene, di-[4-(N,N-ditolylamino)phenyl]cyclohexane, 2,2',7,7'-tetra(N,N-ditolyl)amino-spiro-bifluorene, N,N,N',N'-tetra-naphthalen-2-yl-benzidine and mixtures of these compounds.

The hole-transporting layer may, for example, comprise or consist of HAT-CN.

For the case that the hole-transporting layer is formed from a substance mixture composed of a matrix and p-dopant, the dopant may be selected from a group which comprises $MoO_x$, $WO_x$, $VO_x$, Cu(I)pFBz, Bi(III)pFBz, F4-TCNQ, NDP-2 and NDP-9. One or more of the above-stated materials for the hole-transporting layer may be used as the matrix material.

The hole-transporting layer of the charge carrier generation layer stack may have transmission which is greater than 90% in a wavelength range from approximately 400 nm to approximately 700 nm, in particular in a wavelength range from 450 nm to 650 nm.

The hole-transporting layer may have a layer thickness in a range from approximately 1 nm to approximately 500 nm.

The electron-transporting layer may comprise a material which is selected from a group which comprises NET-18, 2,2',2"-(1,3,5-benzinetriyl)-tris(1-phenyl-1-H-benzimidazole, 2-(4-biphenylyl)-5-(4-tert.-butylphenyl)-1,3,4-oxadiazole, 2,9-dimethyl-4,7-diphenyl-1,10-phenanthroline (BCP), 8-hydroxyquinolinolatolithium, 4-(naphthalen-1-yl)-3,5-diphenyl-4H-1,2,4-triazole, 1,3-bis[2-(2,2'-bipyridin-6-yl)-1,3,4-oxadiazo-5-yl]benzene, 4,7-diphenyl-1,10-phenanthroline (BPhen), 3-(4-biphenylyl)-4-phenyl-5-tert.-butylphenyl-1,2,4-triazole, bis(2-methyl-8-quinolinolate)-4-(phenylphenolato) aluminum, 6,6'-bis[5-(biphenyl-4-yl)-1, 3,4-oxadiazo-2-yl]-2,2'-bipyridyl, 2-phenyl-9,10-di (naphthalen-2-yl)anthracene, 2,7-bis[2-(2,2'-bipyridin-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalen-2-yl)-4,7-diphenyl-1,10-phenanthroline, 2,9-bis(naphthalen-2-yl)-4,7-diphenyl-1,10-phenanthroline, tris (2,4,6-trimethyl-3-(pyridin-3-yl)phenyl)borane, 1-methyl-2-(4-(naphthalen-2-yl)phenyl)-1H-imidazo[4,5-f][1,10] phenanthroline, phenyldipyrenylphosphine oxide, naphthalenetetracarboxylic dianhydride and the imides thereof, perylenetetracarboxylic dianhydride and the imides thereof, materials based on siloles with a silacyclopentadiene unit and mixtures of the above-stated substances.

If the electron-transporting layer is formed from a substance mixture composed of a matrix and n-dopant, the matrix may comprise one of the above-stated materials of the electron-transporting layer. The matrix may, for example, comprise or be NET-18. The n-dopant of the electron-transporting layer may be selected from a group which comprises NDN-1, NDN-26, Na, Ca, MgAg, Cs, Li, Mg, $Cs_2CO_3$, and $Cs_3PO_4$.

The electron-transporting layer may have a layer thickness in a range from approximately 1 nm to approximately 500 nm.

If metal-containing or metal-free TAPs are used as material of the filter layer, the filter layer is particularly suitable as an interlayer of the charge carrier generation layer stack. In addition to the above-stated characteristics as a filter, the filter layer simultaneously has characteristics which makes it suitable as an interlayer of a charge carrier generation layer stack. This is, for example, due to the structural and photophysical similarity between TAPs and the corresponding phthalocyanine derivatives, since they are similar in morphology to phthalocyanine derivatives and may thus be formed in thin layers and simultaneously ensure effective separation of the p- and n-doped layers in the charge carrier generation layer stack and low voltage loss operation of the device. In this embodiment, in which the interlayer simultaneously acts as a filter layer, an additional filter layer in or on the device is moreover unnecessary, so meaning that the shape and design advantage of the device may be retained.

The device may moreover comprise an outcoupling layer between the substrate and the first electrode. The outcoupling layer may, for example, be a scattering layer arranged on the substrate. According to at least one embodiment, the scattering layer comprises a matrix material and scattering centers embedded therein. The matrix material is, for example, an optically highly refractive glass or a polymeric material. Polymeric materials are, for example, selected from a group which comprises polycarbonate (PC), polyethylene naphthalate (PEN), polyethylene terephthalate (PET), polymethyl methacrylate (PMMA), polyurethane and epoxides. The scattering centers may be cavities in the scattering layer which may be evacuated or filled with a gas such as desiccated air, nitrogen or argon. The scattering centers may likewise be formed of particles which, for example, comprise or consist of silicon dioxide, titanium dioxide, zirconium dioxide, hafnium oxide, tantalum oxide or aluminum oxide. The second electrode may moreover be highly reflective. To this end, the second electrode may, for example, contain or consist of a metal. The substrate and first electrode may then be translucent.

According to a further embodiment, the second wavelength range comprises a low-energy sub-range and a high-energy sub-range and the absorption range of the filter layer contains the low-energy or high-energy sub-range of the second wavelength range. The filter layer may thus absorb the low- or high-energy sub-range of the second wavelength range. All the characteristics stated above with regard to the first wavelength range and the filter layer may thus also be applied mutatis mutandis to the second wavelength range and hence to the filter layer.

In particular if the device contains two organic functional layer stacks and a charge carrier generation layer stack and an outcoupling layer, the outcoupling layer between the substrate and the first electrode may intensify the filter effect of the filter layer which simultaneously takes the form of an interlayer of the charge carrier generation layer stack. Due to the multiple reflections of the radiation emitted by the first organic functional layer stack and the second organic functional layer stack brought about by the outcoupling layer, the radiation passes repeatedly through the filter layer, the intensity in unwanted spectral ranges is again distinctly attenuated and thus the dominant wavelength of the first and second organic functional layer stacks is shifted further.

By varying the material of the filter layer and the layer thickness thereof, it is possible to control the extent of filtering, i.e. the reduction in intensity of the high-energy or low-energy sub-regions of the first and/or second wavelength range. The filter layer may, for example, have a thickness which is selected from the range 1 to 50 nm, preferably 1 to 10 nm and particularly preferably 1 to 5 nm.

According to one embodiment, the second wavelength range is selected from the red spectral range. Both the first wavelength range and the second wavelength range may thus be selected from the red spectral range. The first and second wavelength range may be identical.

The absorption range of the filter layer may moreover contain the high-energy sub-range of the second wavelength range. The filter layer may thus absorb the high-energy sub-range of the first and second wavelength range. It is thus possible to provide a device which emits red radiation which is shifted by the filter layer into the dark red range, since the high-energy sub-range of the first wavelength range and the high-energy sub-range of the second wavelength range are absorbed by the filter layer. Such a device may, for example, have a dominant wavelength of above 615 nm and in particular of above 620 nm. The device is thus suitable, for example, for use a rear light or brake light in the automotive industry.

According to one embodiment, the organic light-emitting device may take the form of an organic light-emitting diode (OLED).

A method for producing a device according to one of the above embodiments is moreover provided. The method comprises the following method steps A) arranging a first electrode on a substrate, B) forming at least one first organic functional layer stack on the first electrode, C) arranging a second electrode on the first organic functional layer stack.

During or after method step A), a filter layer is arranged in the beam path of the first organic functional layer stack.

A device having the above-stated characteristics may thus be produced by the method. The filter layer may, for example, be applied onto the substrate or onto the first electrode.

In a method step A1) following method step A), a second organic functional layer stack may moreover be applied onto the first electrode applied, and in a method step A2) following method step A1) a charge carrier generation layer stack may be applied onto the second organic functional layer stack. In this embodiment, the filter layer is arranged in the device in method step A2) as an interlayer of the charge carrier generation layer stack. Said filter layer is here arranged between the hole-transporting layer and the electron-transporting layer of the charge carrier generation layer stack.

The filter layer may be arranged by vapor deposition or by application of a solution. Vapor deposition may, for example, proceed at temperatures in the range 200° C. to 600° C. The filter layer may be applied under a vacuum

BRIEF DESCRIPTION OF THE DRAWINGS

Further advantages, advantageous embodiments and further developments are revealed by the following exemplary embodiments described below in association with the figures.

Figure 1A:
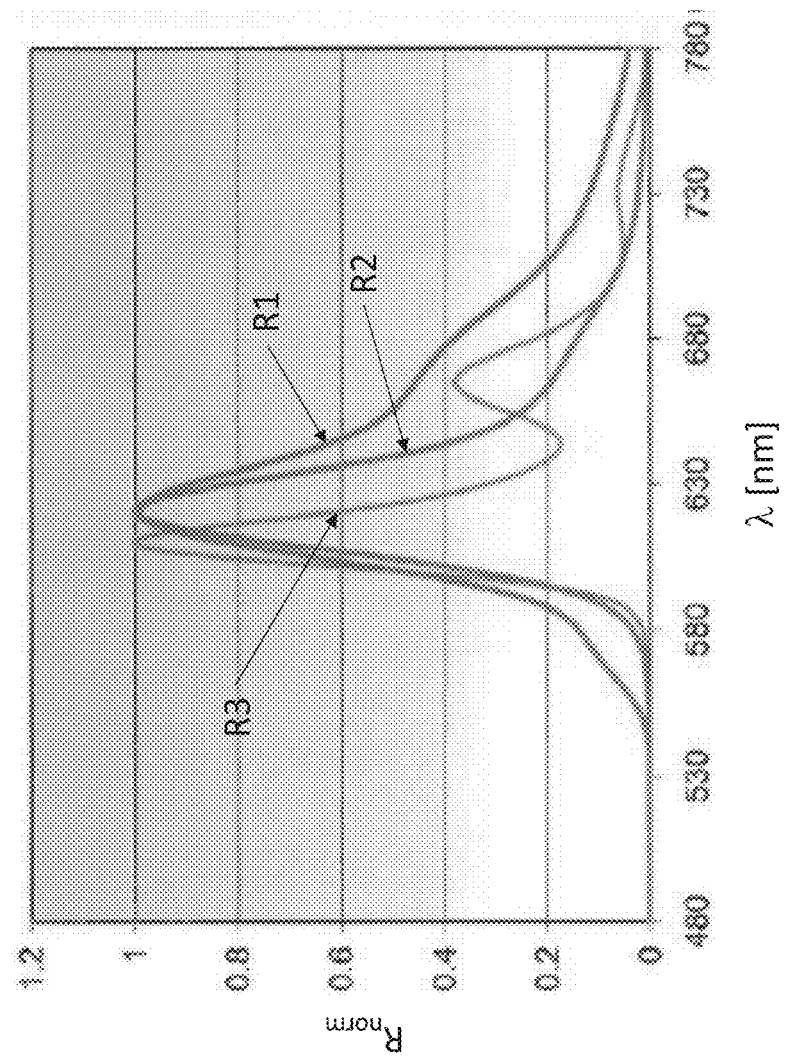
FIGS. 1a and 1b show emission spectra and simulated emission spectra of conventional red emitter materials.

In the exemplary embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

FIG. 1a shows emission spectra of three examples of conventional red emitter materials which may, for example, be used in the first and/or second organic functional layer stack. Wavelength λ in nm is plotted against normalized radiation $R_{norm}$. R1 indicates the spectrum of a phosphorescent emitter with CIE system coordinates of 0.654/0.345. This emitter has a dominant wavelength of 607 nm. R2 indicates the spectrum of a first fluorescent red emitter with CIE coordinates of 0.672/0.327 and a dominant wavelength of 612 nm. The spectrum of a second fluorescent red emitter is indicated by R3 and has CIE coordinates of 0.664/0.334 and a dominant wavelength of 610 nm.

These red emitters are not capable of generating a dark red emission, since their dominant wavelength is between 607 and 612 nm. The high-energy sub-regions of the emission spectra, namely at wavelengths of between approximately 540 and 600 nm, have an influence on color appearance in this respect. A dominant wavelength of >615 nm, preferably >620 nm, would be desirable to achieve a dark red color appearance.

Figure 1B:
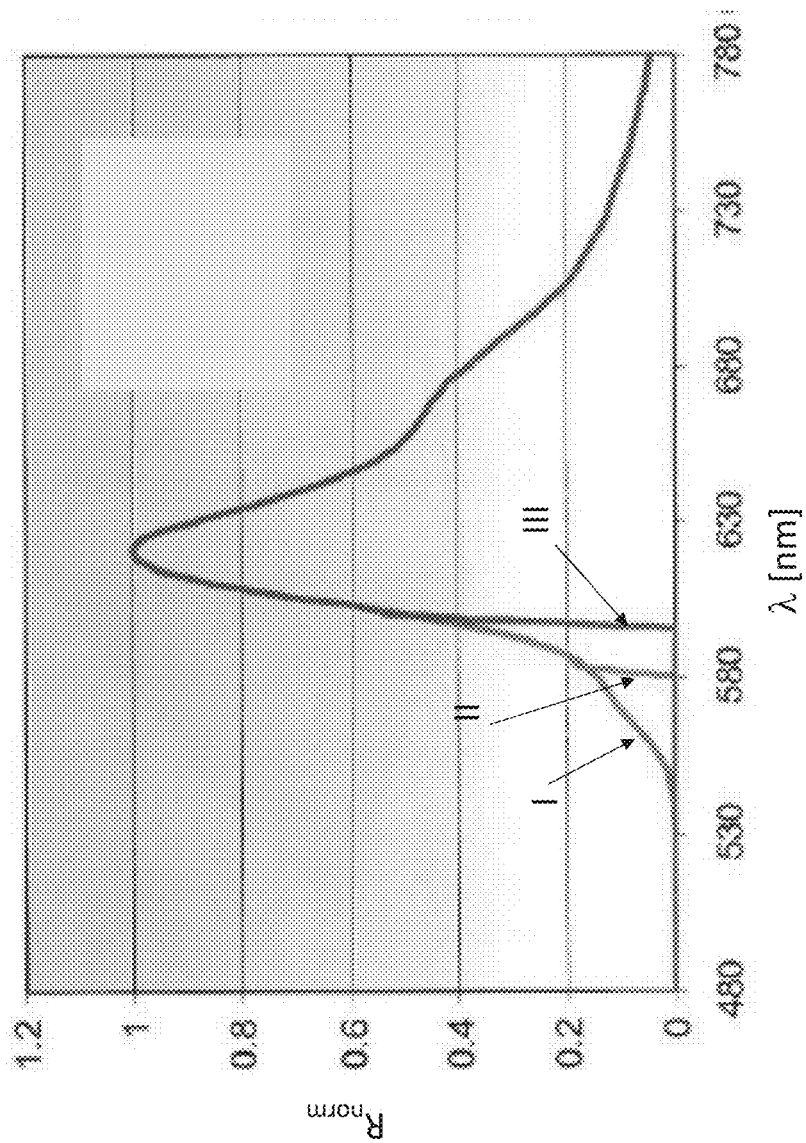

FIG. 1b shows simulated emission spectra of the red emitter R1. Again, wavelength λ in nm is plotted against normalized radiation $R_{norm}$. Curve I shows the measured spectrum of the red emitter having the CIE coordinates already stated in relation to FIG. 1a and a dominant wavelength of 607 nm. If the high-energy tails are attenuated, the dominant wavelength may be shifted towards larger wavelengths. Curve II accordingly shows a simulation of the emission spectrum being cut off at 580 nm, resulting in a dominant wavelength of 613 nm and CIE coordinates of 0.671/0.328. Curve III cuts the emission band off at 596 nm, resulting in CIE coordinates of 0.685/0.315 and a dominant wavelength of 619 nm. The simulation thus shows that, by attenuating the high-energy tails of the emission spectrum, the resultant dominant wavelength may be shifted towards the dark red spectral range.

High-energy tails may, for example, be absorbed by tetraazaporphyrin derivatives (TAPs). Structural formula I shows an example of such a TAP:

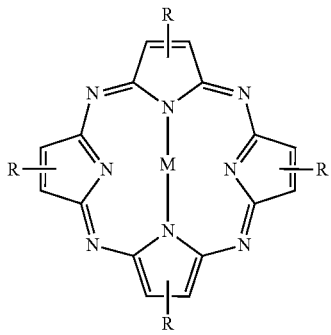

Structural formula I

M denotes $H_2$ for a metal-free variant or Mg, VO, Cu, Co, TiO, Ni, Zn, Al, Fe, SnO or Mn for metal-containing TAPs. The substituents R may mutually independently be selected from H or alkyl, wherein alkyl may be, for example, methyl, ethyl, propyl or tert.-butyl. Structural formula Ia shows an example of a TAP, in which tert.-butyl has been selected for each R:

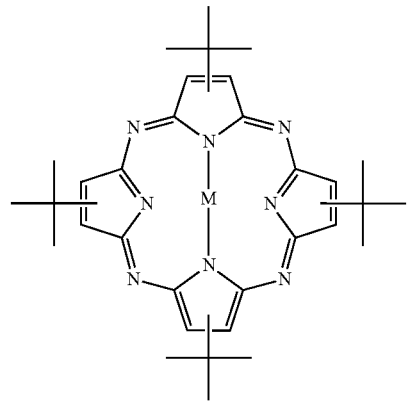

Structural formula Ia

Table 1 shows examples of TAPs together with their absorption maxima $\lambda_{max}$ and their absorbance ε:

TABLE 1

| TAP derivative | λmax [nm] (kcm$^{-1}$) | ε (logε) |
| --- | --- | --- |
| $H_2$TAP | 619.0 (16.15) | 61,800 (4.79) |
| CoTAP | 570.0 (17.54) | 40,600 (4.61) |
| CuTAP | 583.4 (17.14) | 73,700 (4.87) |
| VOTAP | 594.0 (16.84) | 48,400 (4.68) |
| MgTAP | 592.0 (16.89) | 45,300 (4.66) |

Figure 2:
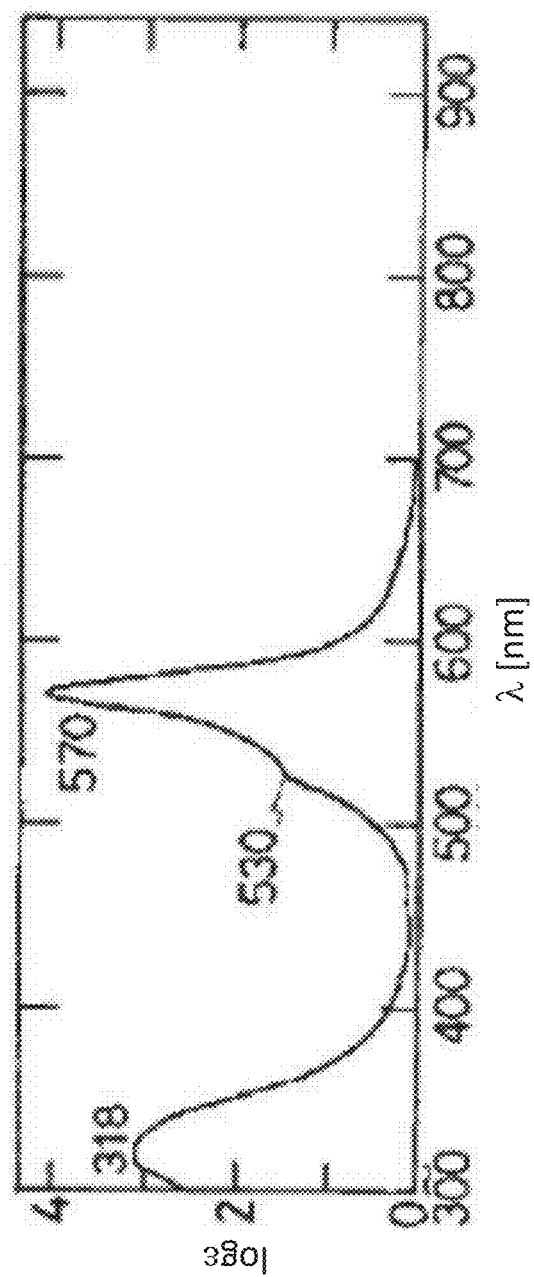
FIG. 2 shows an absorption spectrum of a TAP.

FIG. 2 shows an associated absorption spectrum (for the CoTAP example) in which wavelength λ in nm is plotted against log absorbance logε. As is apparent, the TAPs, in particular the metal-containing TAPs, have absorptions in ranges which correspond to the high-energy sub-regions of the emission spectra of the red emitters, as were, for example, shown in FIG. 1a; in this example, the absorption of the TAP is approximately between 500 and 600 nm. TAPs are thus a suitable material for the filter layer, for example, in an OLED, for attenuating high-energy emission bands of conventional red emitters. Simultaneously, such a filter layer may take the form of an interlayer of a charge carrier generation layer sequence thanks to its similar structure and hence similar characteristics to corresponding phthalocyanine derivatives.

Figure 3:
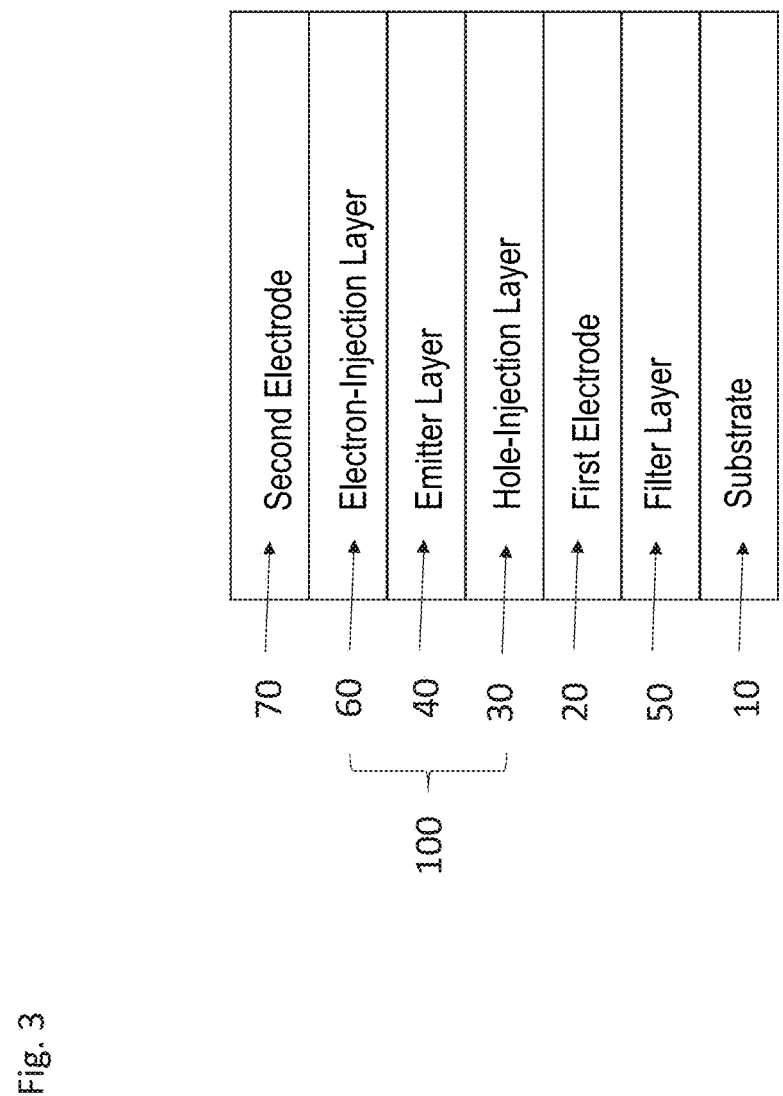
FIG. 3 shows a schematic side view of an organic light-emitting device according to one embodiment.

FIG. 3 shows a schematic side view of an organic light-emitting device taking an OLED by way of example. The figure shows the substrate 10, the filter layer 50 thereon, the first electrode 20 thereon, the hole-injection layer 30 thereon, the emitter layer 40 thereon, the electron-injection layer 60 thereon and the second electrode 70 thereon. In this example, the hole-injection layer 30, emitter layer 40 and electron-injection layer 60 form the first organic functional layer stack 100.

The substrate 10 acts as carrier element and is, for example, formed of glass, quartz and/or a semiconductor material. Alternatively, the substrate 10 may also be a plastics film or a laminate of a plurality of plastics films. In this case, the first electrode 20 takes the form of the anode and may, for example, comprise ITO as material. The second electrode 70 takes the form of the cathode and, for example, contains a metal or a TCO. The substrate 10 and first electrode 20 are moreover translucent, such that radiation emitted by the first organic layer stack 100 is emitted from the device through the filter layer 50 arranged on the substrate 10.

Materials for the hole-injection layer 30 may be selected from known materials. Materials may, for example, be selected from the materials stated for the hole-transporting layer of the charge carrier generation layer stack. Materials for the electron-injection layer 60 may likewise be selected from known materials, for example, from materials which have been mentioned above with regard to the electron-transporting layer of the charge carrier generation layer stack. The emission layer 40, for example, contains a red emitting material, for example, one of the materials mentioned in relation to FIG. 1a.

The filter layer 50 contains a TAP which is selected from CoTAP, NiTAP, CuTAP, MgTAP, TiOTAP, VOTAP, $H_2$TAP, ZnTAP, AlTAP, FeTAP, SnOTAP and MnTAP. The radiation generated in the emission layer 40 is thus emitted from the device through the filter layer 50, whereby the dominant wavelength of the emission layer 40 is shifted by the filter layer 50 to larger wavelengths. For an external observer, the overall appearance of the emitted radiation is thus a dark red color spectrum.

FIG. 3 does not show further layers of the first organic functional layer stack 100, such as, for example, hole- or electron-blocking layers. Moreover, the filter layer 50 may alternatively be arranged on the first electrode 20.

Figure 4A:
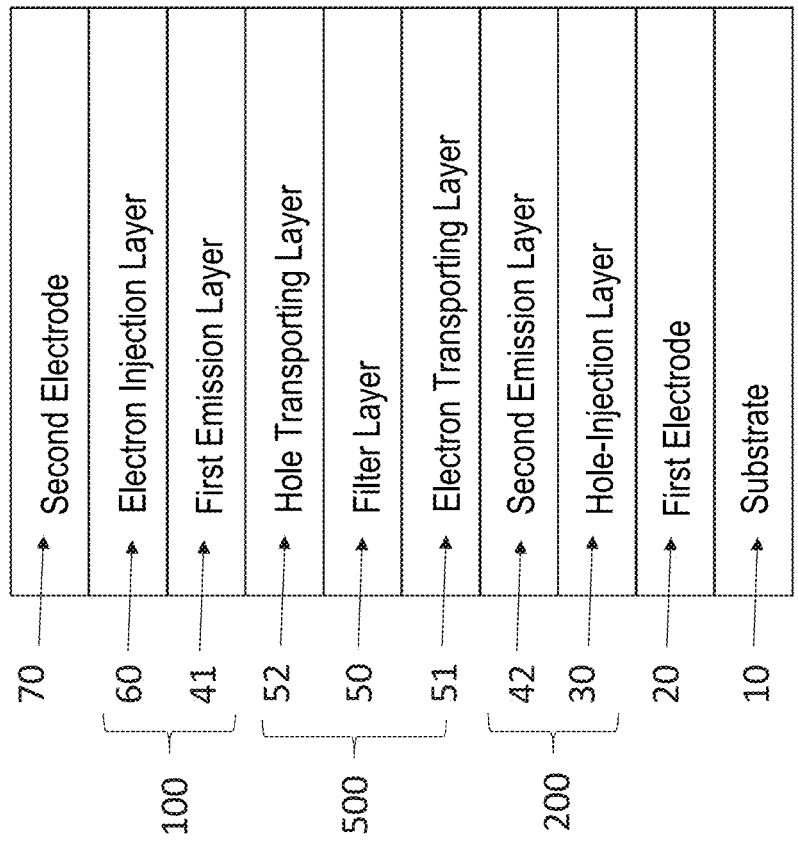
FIGS. 4a and 4b show schematic side views of further embodiments of an organic light-emitting device.
Figure 4B:
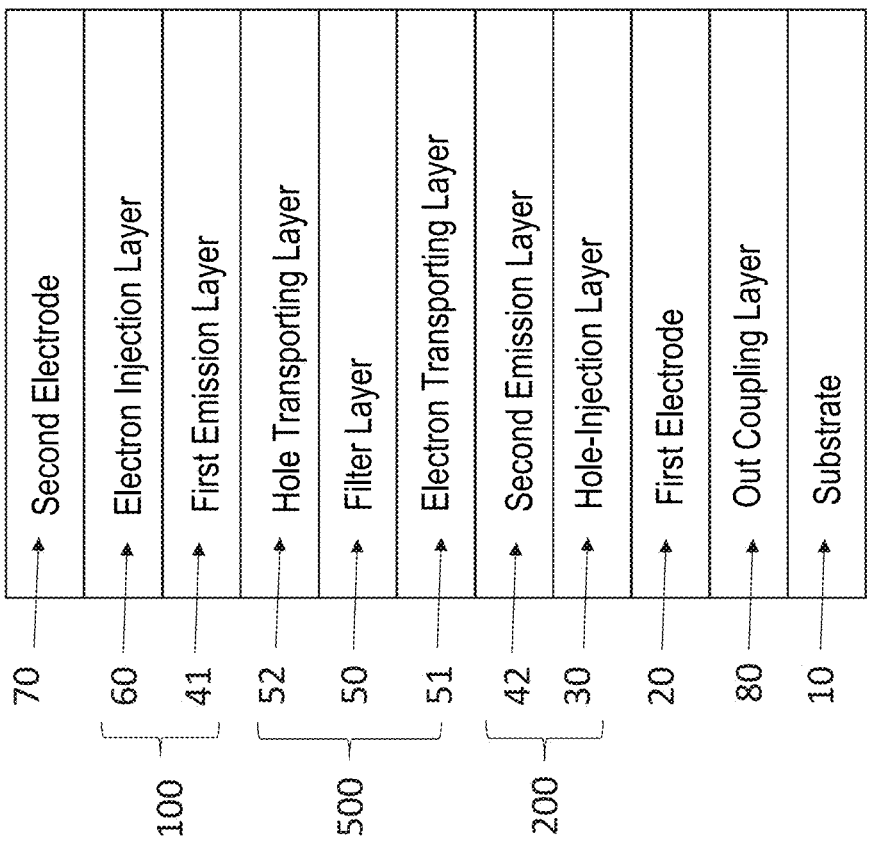

FIGS. 4a and 4b show schematic side views of embodiments of the devices taking stacked OLEDs by way of example.

FIG. 4a again shows a substrate 10 which in this example is a translucent glass substrate. Arranged thereon is the first electrode 20, which takes the form of the anode and in this example contains ITO. The hole-injection layer 30 is arranged on the anode 20, which hole-injection layer, for example, contains a p-doped system such as NHT49:NDP9 or a system of HAT-CN and a hole-transport material such as α-NPD. The second emission layer 42 is arranged on the hole-injection layer 30, which second emission layer contains a red emitter, for example, the phosphorescent emitter explained in connection with FIG. 1, which is embedded in a matrix, or another fluorescent or phosphorescent red emitter doped in a low percentage in a matrix. Conventional fluorescent emitters are, for example, DCM, DCM2, DCJT and DCJTB, conventional phosphorescent emitters are, for example, Ir(piq)$_3$, Ir(piq)$_2$(acac), Ir(DBQ)$_2$(acac), Ir(btp)$_2$(acac), PtOEP, Pt(Ph-salen) or Pt(ppy$_2$-tBu$_2$-aniline). The first emission layer 41 may contain the same emitter as the second emission layer 42. The electron-transporting layer 51, the filter layer 50 and the hole-transporting layer 52 constitute the charge carrier generation layer stack 500. The electron-transporting layer 51 consists in this example of an n-doped system such as NET18:NDN26, as does the electron-injection layer 60 arranged on the first emission layer 41. The hole-transporting layer 52, on which the first emission layer 41 is arranged, may contain the same material as the hole-injection layer 30, thus, for example, NHT49:NDP9 or a system of HAT-CN and a hole-transport material such as α-NPD.

The electron-transporting layer 51 and hole-transporting layer 52 are separated by the filter layer 50, the latter also having the function of an interlayer. The filter layer 50 contains a TAP such as, for example, CoTAP, CuTAP, MgTAP, NiTAP, TiOTAP, VOTAP, $H_2$TAP, ZnTAP, AlTAP, FeTAP, SnOTAP and MnTAP.

In this example, the hole-injection layer 30 and second emission layer 42 of the second organic functional layer stack 200, the first emission layer 41 and the electron-injection layer 60 of the first organic functional layer stack 100 and the electron-transporting layer 51, the filter layer 50 and the hole-transporting layer 52 are the charge carrier generation layer stack 500.

In addition to functioning as an interlayer, i.e. separating the p- and n-layers of the charge carrier generation layer stack 500, the filter layer 50 also serves as an internal filter by absorbing a major part of the intensity in the unwanted high-energy sub-range, thus the yellow to light red spectral range of the first organic functional layer stack 100.

The second electrode 70 takes the form of the cathode in this example and may, for example, contain a metal or a TCO. The substrate 10 and first electrode 20 are translucent.

The device shown in FIG. 4b corresponds in structure to the example shown in FIG. 4a, but contains an additional scattering layer which serves as outcoupling layer 80 and is arranged between the substrate 10 and first electrode 20. The scattering layer contains a matrix material and scattering centers embedded therein. The matrix material is, for example, an optically highly refractive glass or a polymeric material. Polymeric materials are, for example, polycarbonate (PC), polyethylene naphthalate (PEN), polyethylene terephthalate (PET), polymethyl methacrylate (PMMA), polyurethane and epoxides. The scattering centers may be cavities in the scattering layer which may be evacuated or filled with a gas such as desiccated air, nitrogen or argon. The scattering centers may likewise be formed of particles which, for example, comprise or consist of silicon dioxide, titanium dioxide, zirconium dioxide, hafnium oxide, tantalum oxide or aluminum oxide. In this case, the second electrode 70 preferably contains a cathode material with high reflectivity such as, for example, silver. Due to the multiple reflections brought about by the outcoupling layer, the radiation emitted by the first and second organic functional layer stacks 100, 200 passes through the filter layer 50, such that the high-energy sub-regions of both the first and second wavelength ranges are absorbed by the filter layer 50. As a consequence, the overall emission of the device is shifted further into the dark red spectral range.

The description made with reference to the exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An organic light-emitting device comprising:
   a substrate;
   a first electrode disposed on the substrate;
   at least one first organic functional layer stack disposed on the first electrode, the first organic functional layer stack configured to emit radiation in a first wavelength range;
   a second electrode disposed on the first organic functional layer stack; and
   a filter layer arranged in a beam path of the first organic functional layer stack,
   wherein the first wavelength range comprises a low-energy sub-range and a high-energy sub-range,
   wherein the filter layer comprises an absorption range containing the low-energy sub-range or the high-energy sub-range of the first wavelength range, and
   wherein the filter layer is arranged between the first electrode and the second electrode.

2. The device according to claim 1, wherein the filter layer contains a material which is selected from the group consisting of metal-containing and metal-free tetraazaporphyrin derivatives (TAPs).

3. The device according to claim 2, wherein the metal-containing tetraazaporphyrin derivatives are selected from the group consisting of CoTAP, NiTAP, CuTAP, MgTAP, TiOTAP, VOTAP, ZnTAP, AlTAP, FeTAP, SnOTAP and MnTAP.

4. The device according to claim 1, wherein the filter layer has a thickness between 1 nm and 50 nm.

5. The device according to claim 1, wherein the first wavelength range comprises a red spectral range.

6. The device according to claim 5, wherein the absorption range of the filter layer contains the high-energy sub-range of the first wavelength range.

7. The device according to claim 1, wherein the filter layer is arranged between the first electrode and the first organic functional layer stack.

8. The device according to claim 1, further comprising:
a second organic functional layer stack configured to emit radiation in a second wavelength range, the second organic functional layer stack is disposed between the first electrode and the first organic functional layer stack; and
a charge carrier generation layer stack disposed between the second organic functional layer stack and the first organic functional layer stack.

9. The device according to claim 8, wherein the charge carrier generation layer stack comprises at least one hole-transporting layer and an electron-transporting layer, and wherein the filter layer is arranged between the hole-transporting layer and the electron-transporting layer.

10. The device according to claim 8, further comprising an outcoupling layer between the substrate and the first electrode.

11. The device according to claim 8, wherein the second wavelength range comprises a low-energy sub-range and a high-energy sub-range, and wherein the absorption range of the filter layer contains the low-energy sub-range or the high-energy sub-range of the second wavelength range.

12. The device according to claim 11, wherein the second wavelength range comprises a red spectral range.

13. The device according to claim 12, wherein the absorption range of the filter layer contains the high-energy sub-range of the second wavelength range.

* * * * *